United States Patent
Choi

(10) Patent No.: US 9,299,753 B2
(45) Date of Patent: Mar. 29, 2016

(54) ORGANIC LIGHT-EMITTING DISPLAY APPARATUS AND METHOD OF MANUFACTURING THE SAME

(71) Applicant: Samsung Display Co., Ltd., Yongin (KR)

(72) Inventor: Jung-Ho Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/504,070

(22) Filed: Oct. 1, 2014

(65) Prior Publication Data

US 2015/0340414 A1  Nov. 26, 2015

(30) Foreign Application Priority Data

May 23, 2014  (KR) .................. 10-2014-0062592

(51) Int. Cl.
  *H01L 27/32* (2006.01)
  *H01L 51/52* (2006.01)
  *H01L 51/56* (2006.01)

(52) U.S. Cl.
  CPC ........ *H01L 27/3246* (2013.01); *H01L 27/3211* (2013.01); *H01L 51/5237* (2013.01); *H01L 51/56* (2013.01)

(58) Field of Classification Search
  CPC . H01L 51/56; H01L 27/3246; H01L 27/3248; H01L 2227/323; H01L 27/326; H01L 51/5203; H01L 27/32; H01L 27/124; H01L 27/1259; H01L 27/3225; H01L 21/76894; H01L 2251/5315; H01L 27/3218; H01L 51/5012; H01L 27/3209; H01L 29/78621; H01L 51/5056; H01L 51/5072; H01L 51/5088; H01L 51/5092; H01L 51/5237; H01L 51/5296; G09G 2330/08; G09G 2300/0426; G09G 2300/0809; G09G 2330/12; G09G 3/3233; G09G 1/136259

See application file for complete search history.

(56) References Cited

U.S. PATENT DOCUMENTS

| | | | | |
|---|---|---|---|---|
| 7,402,944 | B2 * | 7/2008 | Jeong et al. | 313/503 |
| 8,901,563 | B2 * | 12/2014 | Park et al. | 257/59 |
| 8,951,700 | B2 * | 2/2015 | Eom | 430/7 |
| 2005/0048316 | A1 * | 3/2005 | Kim et al. | 428/690 |
| 2005/0062039 | A1 * | 3/2005 | Kim | 257/40 |
| 2005/0123801 | A1 * | 6/2005 | Yang et al. | 428/690 |
| 2006/0022587 | A1 * | 2/2006 | Jeong et al. | 313/504 |
| 2006/0051533 | A1 * | 3/2006 | Song et al. | 428/32.81 |
| 2006/0055999 | A1 * | 3/2006 | Bae et al. | 359/245 |

(Continued)

FOREIGN PATENT DOCUMENTS

| | | |
|---|---|---|
| KR | 10-2006-0061912 | 6/2006 |
| KR | 10-0705266 | 4/2007 |

(Continued)

*Primary Examiner* — Evan Pert
*Assistant Examiner* — Gustavo Ramallo
(74) *Attorney, Agent, or Firm* — H.C. Park & Associates, PLC

(57) ABSTRACT

An organic light-emitting display apparatus in which damages or defects are decreased when forming an emission layer, and a method of manufacturing the organic light-emitting display apparatus includes: a pixel electrode; an emission layer disposed on the pixel electrode and is capable of emitting light; a pixel defining layer that covers at least a portion of an edge of the emission layer such that a center portion of the emission layer is exposed; and an opposite electrode continuously formed over and across the pixel defining layer and the emission layer.

17 Claims, 10 Drawing Sheets

(56) References Cited

U.S. PATENT DOCUMENTS

| | | | |
|---|---|---|---|
| 2006/0060865 A1* | 3/2006 | Cho et al. | 257/79 |
| 2010/0051912 A1* | 3/2010 | Gregory | 257/40 |
| 2012/0001185 A1* | 1/2012 | Lee et al. | 257/59 |
| 2012/0049169 A1* | 3/2012 | Kim | 257/40 |
| 2013/0256676 A1* | 10/2013 | Jin et al. | 257/72 |
| 2014/0145179 A1* | 5/2014 | Yoon et al. | 257/43 |

FOREIGN PATENT DOCUMENTS

| | | |
|---|---|---|
| KR | 10-2010-0068644 | 6/2010 |
| KR | 10-2011-0070170 | 6/2011 |

* cited by examiner

ORGANIC LIGHT-EMITTING DISPLAY APPARATUS AND METHOD OF MANUFACTURING THE SAME

RELATED APPLICATION

This application claims priority from and the benefit of Korean Patent Application No. 10-2014-0062592, filed on May 23, 2014, which is hereby incorporated by reference for all purposes as if fully set forth herein.

BACKGROUND

1. Field

Exemplary embodiments relate to an organic light-emitting display apparatus and a method of manufacturing the same, and more particularly, to an organic light-emitting display apparatus in which damage and/or defects are decreased when forming an emission layer, and a method of manufacturing the organic light-emitting display apparatus.

2. Discussion of the Background

An organic light-emitting display apparatus includes an organic light-emitting device in a display area. The organic light-emitting device includes an intermediate layer includes an emission layer and is interposed between a pixel electrode and an opposite electrode.

When manufacturing the organic light-emitting display apparatus, the emission layer may be formed using various methods, such as a deposition method, an inkjet printing method, or a laser induced thermal imaging (LITI) method.

However, according to the methods of manufacturing an organic light-emitting display apparatus of the related art, it may be difficult to form an emission layer, the emission layer may be damaged, or defects may be formed in the emission layer.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting display apparatus in which damage and/or defects are decreased when forming an emission layer and a method of manufacturing the organic light-emitting display apparatus.

Additional aspects will be set forth in the detailed description which follows, and, in part, will be apparent from the disclosure, or may be learned by practice of the inventive concept.

According to exemplary embodiments of the present invention, an organic light-emitting display apparatus includes: a pixel electrode; an emission layer that is disposed on the pixel electrode and configured to emit light; a pixel defining layer that covers at least a portion of an edge of the emission layer such that a center portion of the emission layer is exposed; and an opposite electrode continuously formed over and across the pixel defining layer and the emission layer.

According to one or more embodiments of the present invention, a method of manufacturing an organic light-emitting display apparatus, includes: forming a pixel electrode; forming a pixel defining layer having a reverse-tapered shape wherein an area of an upper surface of the pixel defining layer is broader than an area of a lower surface of the pixel defining layer; forming an emission layer on the pixel electrode; melting the pixel defining layer such that the area of the upper surface becomes equal to or less than the area of the lower surface; and forming an opposite electrode that is continuous over and across the pixel defining layer and the pixel electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain the principles of the inventive concept.

These and/or other aspects will become apparent and more readily appreciated from the following description of the illustrated embodiments, taken in conjunction with the accompanying drawings.

DETAILED DESCRIPTION OF THE ILLUSTRATED EMBODIMENTS

Figure 1:
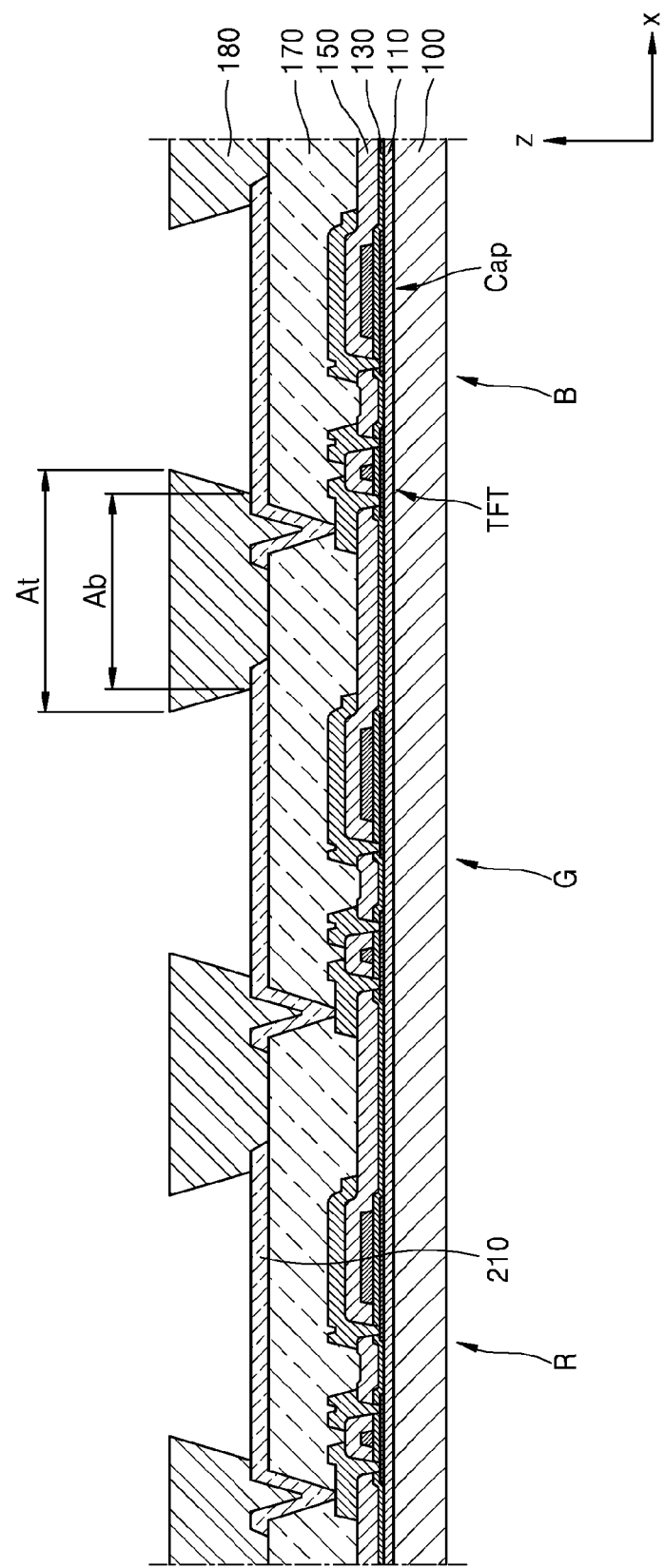
FIGS. 1 through 6 are schematic cross-sectional views illustrating methods of manufacturing an organic light-emitting display apparatus according to exemplary embodiments of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/ or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1 through 6 are schematic cross-sectional views illustrating methods of manufacturing an organic light-emitting display apparatus according to exemplary embodiments of the present invention.

First, as illustrated in FIG. 1, a backplane is prepared. The backplane here may be understood as piece of equipment that includes at least a base substrate 100, a pixel electrode 210 formed or disposed on the base substrate 100, and a pixel defining layer 180. The pixel defining layer 180 may protrude more than the pixel electrode 210 in a +z direction with respect to the base substrate 100, which is disposed to extend in an x-y plane.

The pixel electrode 210 may be a transparent, semitransparent, or a reflective electrode. When the pixel electrode 210 is a transparent or semitransparent electrode, the pixel electrode 210 may be formed of, for example, indium in oxide (ITO), indium zinc oxide (IZO), indium oxide ($In_2O_3$), indium gallium oxide (IGO), or aluminum zinc oxide (AZO). When the pixel electrode 210 is a reflective electrode, the pixel electrode 210 may include a reflective layer formed of Ag, Mg, Al, Pt, Pd, Au, Ni, Nd, Ir, Cr, or a combination thereof, and a layer formed of ITO, IZO, ZnO, or $In_2O_3$. However, the structure and material of the pixel electrode 210 are not limited thereto and may be modified in various manners.

The pixel defining layer 180 may have an opening portion corresponding to or aligned with each subpixel. For example, an opening portion that exposes a center portion of the pixel electrode 210 or the entire pixel electrode 210 may define each pixel. Also, the pixel defining layer 180 may prevent generation of an electric arc at an end portion of the pixel electrode 210 by increasing a distance between the end portion of the pixel electrode 210 and an opposite electrode 230 (see FIG. 6) on the pixel electrode 210.

The pixel defining layer 180 may have an edge having a reverse-tapered form as illustrated in FIG. 1. That is, as shown in FIG. 1, the pixel defining layer 180 may have a tapered form in that the bottom or base of the pixel defining layer 180 is smaller area than a top of the pixel defining layer 180. For example, the pixel defining layer 180 may have a reverse-tapered form having an upper width At that is longer than a lower width Ab. The lower width Ab of the pixel defining layer 180 may denote a width of a cross-section of the pixel defining layer 180 on a plane that includes the pixel defining layer 180 and an upper surface of the pixel electrode 210 in contact with the pixel defining layer 180. In other words, the lower portion having the lower width Ab is disposed toward the pixel electrode 210 while the upper portion having the upper width At is disposed away from the pixel electrode 210.

The pixel defining layer 180 having the above-described shape may be formed using various methods. For example, the pixel defining layer 180 may be formed by using a negative photoresist material in which the entire surface of the base substrate 100 may be coated with a negative photoresist material to cover the pixel electrode 210, thereby forming a photoresist layer. Then, a center portion of the pixel electrode 210 is exposed or remains not covered. As unexposed portions of the negative photoresist are removed in a subsequent development operation, the center portion of the pixel electrode 210 remains. During an exposure operation, more light is radiated to an upper portion of the photoresist layer than to a lower portion of the photoresist layer, and thus, the lower portion of the photoresist layer is relatively removed more than the upper portion thereof, and accordingly, the pixel defining layer 180 having a reverse-tapered shape as illustrated in FIG. 1 may be formed.

The backplane may further include other various components. For example, as illustrated n FIG. 1, a thin film transistor TFT and/or a capacitor Cap may be formed on the base substrate 100. Also, the backplane may further include elements, such as a buffer layer 110 that prevents or decreases penetration or diffusion of impurities into a semiconductor layer of the thin film transistor TFT, a gate insulating layer 130 that insulates the semiconductor layer of the thin film transistor TFT and a gate electrode, an interlayer insulating layer 150 that insulates source and drain electrodes and the gate electrode, a planarization layer 170 that covers the thin film transistor TFT and has an overall planar upper surface, or other components.

Figure 2:
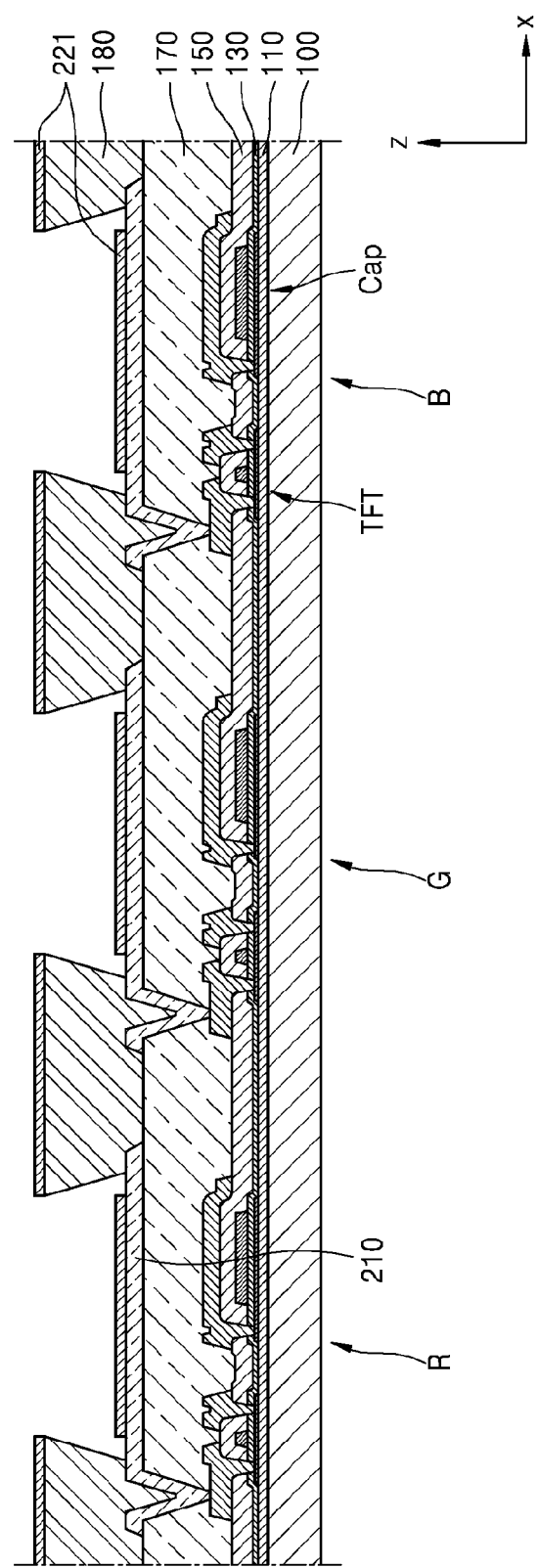

After forming the pixel defining layer 180 having a reverse-tapered shape as described above and illustrated in FIG. 2, a first intermediate layer 221 including at least one selected from a hole injection layer and a hole transport layer is formed on the pixel defining layer 180 and the pixel electrode 210 by using a deposition method. As the pixel defining layer 180 has a reverse-tapered shape, the first intermediate layer 221 may be discontinuous between a portion on the pixel defining layer 180 and a portion on the pixel electrode 210 as illustrated in FIG. 2, i.e., the first intermediate layer 221 may not extend to cover the entire pixel electrode 210. However, when the first intermediate layer 221 is formed using, for example, a spin coating method, the portion of the first intermediate layer 221 on the pixel electrode 210 may extend to a lateral surface of the pixel defining layer 180 to contact the lateral surface, unlike as shown in FIG. 2. The first intermediate layer 221 may not be additionally formed, and may be formed using a laser induced thermal imaging (LITI) method using a donor film.

Figure 3:
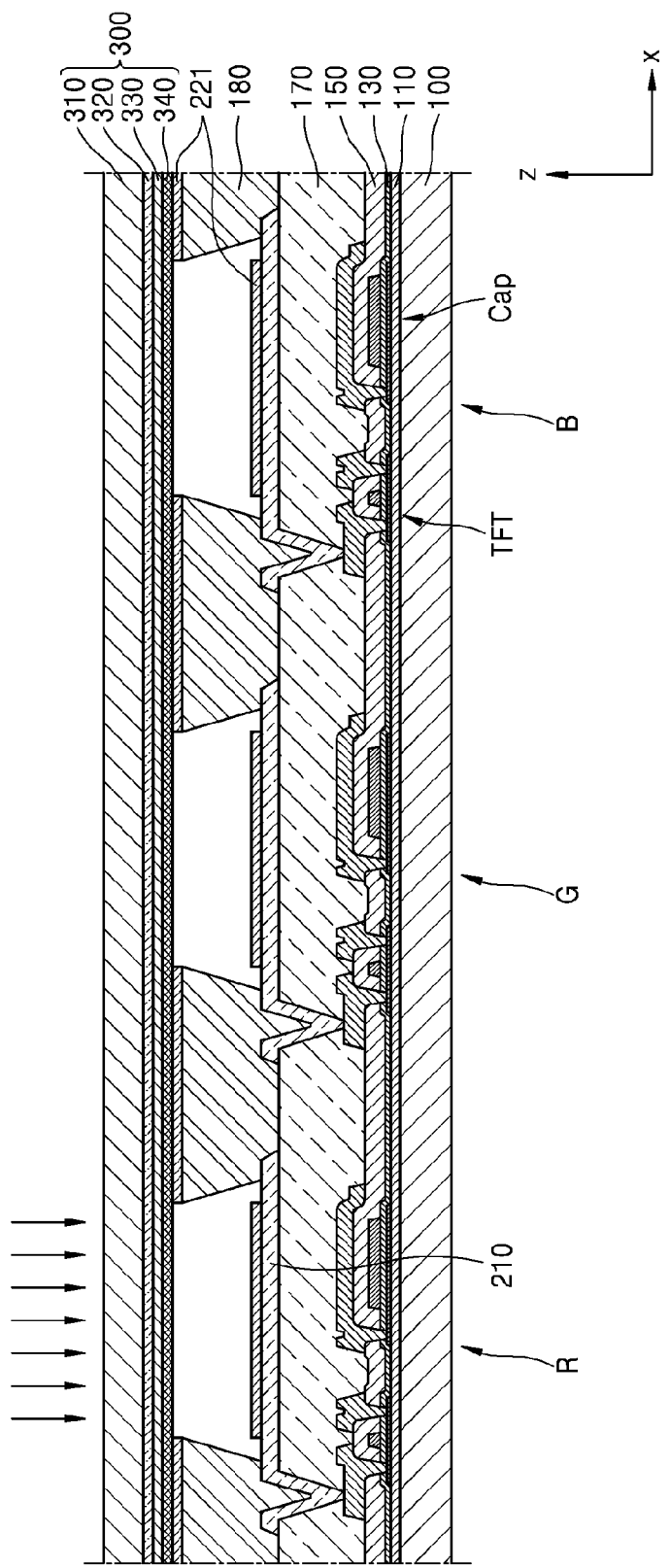

A donor film 300 for LITI is disposed on the backplane as illustrated in FIG. 3. The donor film 300 may include a base film 310, a photothermal conversion layer 320, an intermediate layer 330, and a transfer layer 340.

The base film 310 may be formed of a polyester, such as polyethylene terephthalate (PET), polyacryl, polyepoxy, polyethylene and/or polystyrene, so as to transmit light to the photothermal conversion layer 320.

The photothermal conversion layer 320 absorbs laser light to convert at least a portion of energy of the laser light to heat. The photothermal conversion layer 320 may be a metal layer formed of, for example, aluminum or silver, which is capable of absorbing light in an infrared-to-visible region. Further, the photothermal conversion layer 320 may be an oxide layer or sulfide layer of a metal or a polymer organic layer including carbon black or lead.

The transfer layer 340 is transferred via heat to surfaces the transfer layer 340 contacts, and the transfer layer 340 may include a light-emitting material. However, the transfer layer 340 may include a layer including a hole injection material, a hole transport material, an electron transport material, and/or an electron injection material. Also, the transfer layer 340 may have a multilayer structure.

The intermediate layer 330 may be interposed between the photothermal conversion layer 320 and the transfer layer 340. The intermediate layer 330 may be a gas generating layer that is formed of, for example, pentaerythritol tetranitrate (PETN) or trinitrotoluene (TNT). The intermediate layer 330 absorbs light or heat transferred from the photothermal conversion layer 320 to generate a nitrogen gas or a hydrogen gas. The intermediate layer 330 may be a prevention layer that prevents or protects the transfer layer 340 from being smeared with a portion of the photothermal conversion layer 320 when the transfer layer 340 is transferred. When the intermediate layer 330 is a gas generating layer and the transfer layer 340 is transferred by gas generation, the intermediate layer 330 may allow the transfer layer 340 to be easily separated from the intermediate layer 330 or the photothermal conversion layer 320.

Figure 4:
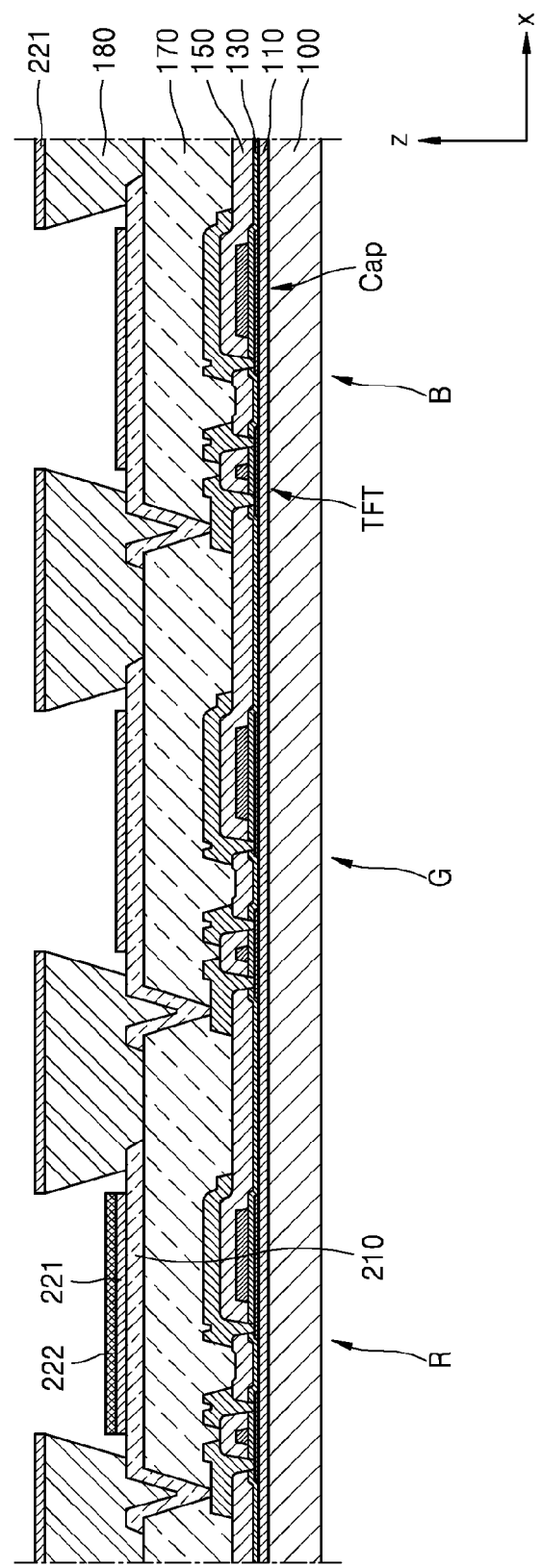

Then, as illustrated in FIG. 3, a laser beam is radiated to a portion of the donor film 300 so that the irradiated portion of the transfer layer 340 of the donor film 300 is transferred to the backplane as illustrated in FIG. 4. In FIG. 4, the donor film has been removed and a transferred portion (emission layer) 222 of the transfer layer 340 has been transferred to the backplane.

For example, when the transfer layer 340 of the donor film 300 includes a material that is capable of emitting red light, a laser beam is radiated to a portion of the donor film 300 corresponding to a red subpixel R from among the red subpixel R, a green subpixel G, and a blue subpixel B of the backplane. Heat and/or gas is generated in a portion of the photothermal conversion layer 320 irradiated by the laser beam, and a portion of the base film 310 irradiated by the laser beam swells due to the heat. Consequently, the portion of the transfer layer 340 irradiated by the laser beam contacts the pixel electrode 210 of the red subpixel R of the backplane or the first intermediate layer 221 on the pixel electrode 210. In addition to the base film 310, the photothermal conversion layer 320, or the intermediate layer 330 may also swell.

Thereafter, when the donor film 300 is removed, only the portion of the transfer layer 340 contacting the pixel electrode 210 of the red subpixel R of the backplane or the first intermediate layer 221 on the pixel electrode 210 remains on the pixel electrode 210 and the donor film 300 including the other portion of the transfer layer 340 is removed. As the pixel defining layer 180 has a reverse-tapered shape, the transfer layer 340 is easily transferred onto the pixel electrode 210 and/or the first intermediate layer 221 on the pixel electrode 210.

If a pixel defining layer has a tapered shape opposite the reverse-tapered shape of the pixel defining layer 180 of FIG. 1, i.e., when the upper area of a pixel defining layer is narrower than the lower area thereof and a lateral surface connecting the upper surface and the lower surface of the pixel defining layer has a gentle slope, as the base film 310 of the donor film 300 swells due to laser irradiation thereon, all surfaces of the transfer layer 340 contact the upper surface and/or the lateral surface of the pixel defining layer, the upper surface and/or the lateral surface of the first intermediate layer 221, and the pixel electrode 210 or the first intermediate layer 221 on the pixel electrode 210.

However, according to the method of manufacturing an organic light-emitting display apparatus according to exemplary embodiments, as the pixel defining layer 180 has a reverse-tapered shape as shown in FIG. 1, the transfer of the transfer portion (emission layer) 222 of the transfer layer 340 may be accomplished more cleanly. That is, when the base film 310 of the donor film 300 swells due to laser beam irradiation, a portion of the transfer layer 340 contacts the pixel electrode 210 or the first intermediate layer 221 on the pixel electrode 210, and the other portion of the transfer layer 340 contacts the upper surface of the pixel defining layer 180 or the first intermediate layer 221 on the upper surface of the pixel defining layer 180. Because the pixel defining layer 180 has a reverse-tapered shape as shown in FIG. 1, a portion between the one portion and the other of the transfer layer 340 does not contact the pixel defining layer 180, the pixel electrode 210, or the first intermediate layer 221. Accordingly, when the donor film 300 is detached from the backplane, the portion of the transfer layer 340 transferred to the backplane may be relatively cleanly separated from the portion of the transfer layer 340 of the donor film 300 where no laser beam is irradiated.

An emission layer 222 may also be formed by using the same LITI method with respect to the green subpixel G and the blue subpixel B in addition to the red subpixel R. According to circumstances, various modifications are possible. For example, a blue emission layer 222 may be formed in both the green subpixel G and the blue subpixel B by using a material capable of emitting blue light using various methods, such as deposition, and a red emission layer and a green emission layer may be formed only in the red subpixel R and the green subpixel G, respectively, by using a LITI method as described above.

Figure 5:
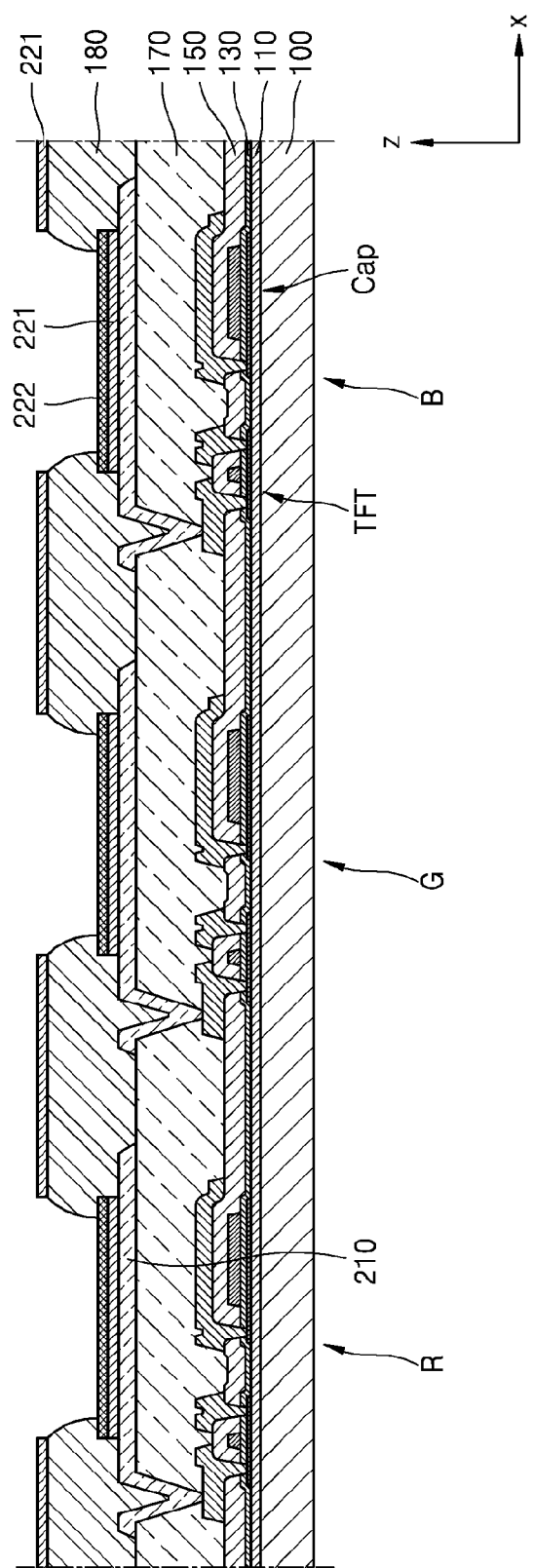

Next, the pixel defining layer 180 is melted or reflowed so that an area of the upper surface thereof is smaller than an area of the lower surface thereof as illustrated in FIG. 5. Accordingly, the pixel defining layer 180 is melted to change the reverse-tapered shape to a tapered shape in which the width of the base is greater than or equal to a width of the top of the pixel defining layer 180. The melting of the pixel defining layer 180 may be performed by using an annealing method. For example, by performing the annealing method at 120° C. for 60 minutes, the pixel defining layer 180 may be melted without any damage to the emission layer 222, or the like, which is formed before the melting operation. As a result of the melting operation, the pixel defining layer 180 is melted to cover at least a portion of an edge of the emission layer 222 while a center portion of the emission layer 222 that is formed on the pixel electrode 210 remains exposed.

Figure 6:
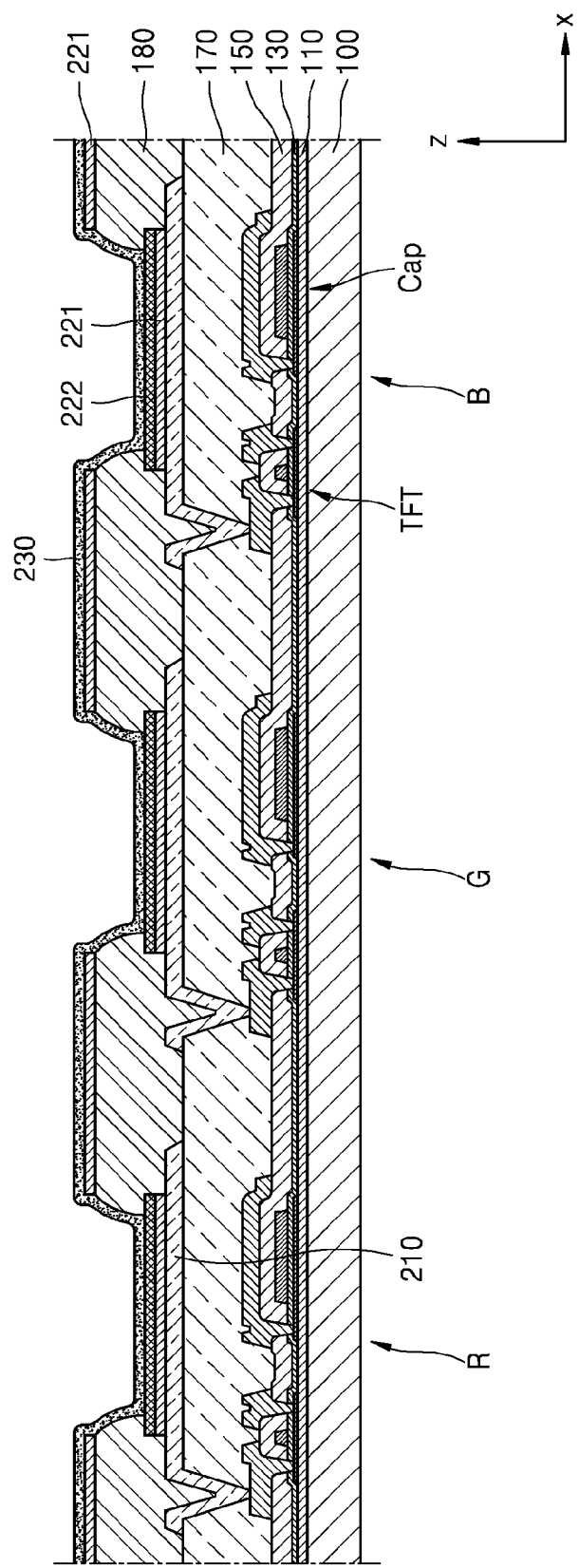

After melting the pixel defining layer 180 as described above, one or more opposite electrodes 230 respectively corresponding to or corresponding to each of the plurality of pixel electrodes 210 may be formed on the entire surface of the base substrate 100, as illustrated in FIG. 6, to thereby manufacture the organic light-emitting display apparatus. As the pixel defining layer 180 having a tapered shape opposite to the reverse-tapered shape of FIG. 1 is formed by the melting thereof before forming the opposite electrodes 230, the opposite electrodes 230 may be formed as a single unit to respectively and continuously correspond to or be disposed on the plurality of pixel electrodes 210.

Figure 7:
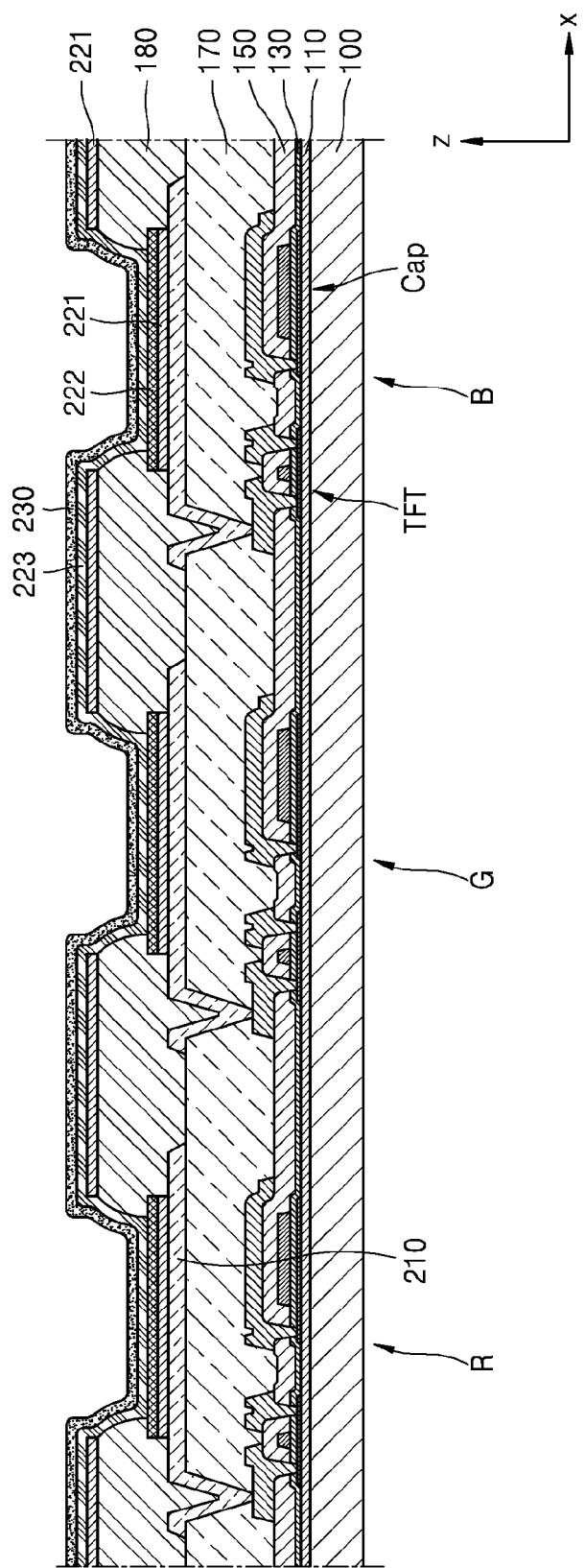
FIG. 7 is a schematic cross-sectional view illustrating methods of manufacturing an organic light-emitting display apparatus according to exemplary embodiments of the present invention.

FIG. 7 is a schematic cross-sectional view illustrating methods of manufacturing an organic light-emitting display apparatus according to exemplary embodiments of the present invention. After melting the pixel defining layer 180, as illustrated in FIG. 7, a second intermediate layer 223 including an electron transport layer, an electron injection layer, or the like may be formed on or to correspond to the plurality of pixel electrodes 210 or on or to correspond to the entire surface of the base substrate 100 by using a deposition method or a LITI method, and then the opposite electrodes 230 may be formed thereon. Here, the second intermediate layer 223 is formed after the pixel defining layer 180 is melted, and thus, a portion of the second intermediate layer 223 on the pixel defining layer 180 and a portion of the second intermediate layer 223 on the pixel electrode 210 may be continuous.

Figure 8:
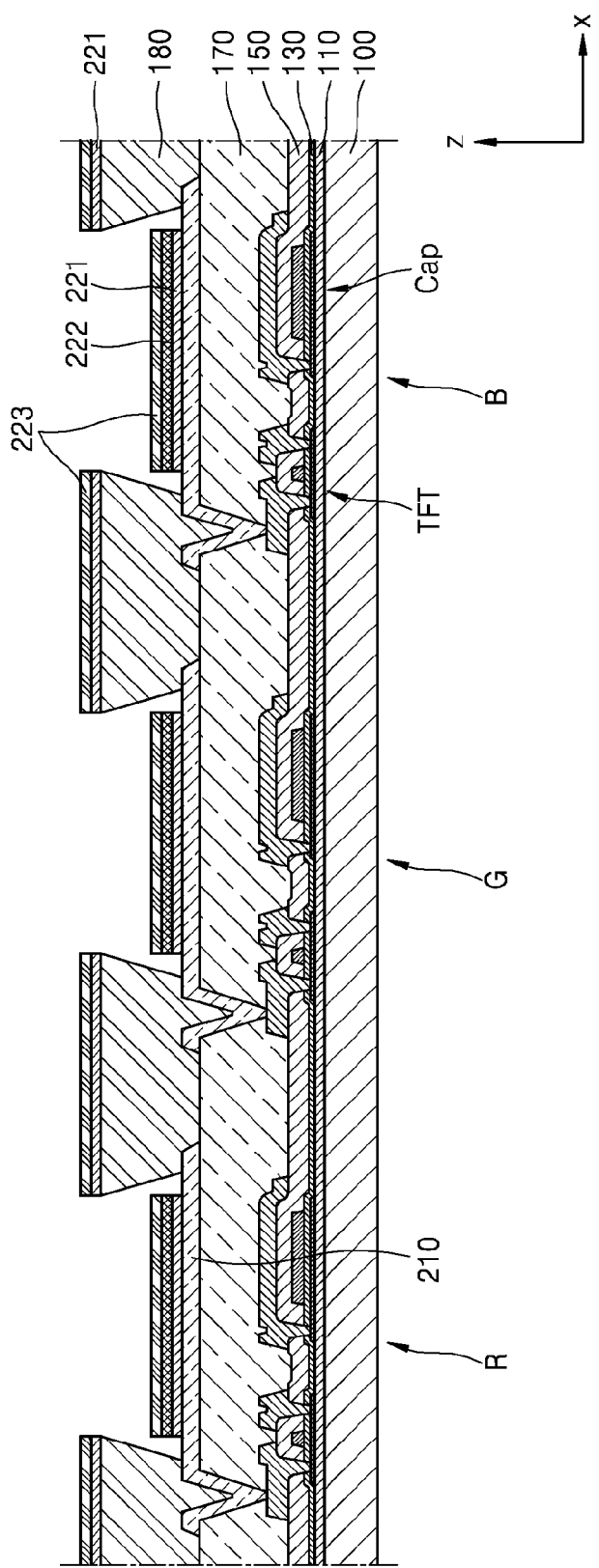
FIGS. 8 through 10 are schematic cross-sectional views illustrating methods of manufacturing an organic light-emitting display apparatus according to exemplary embodiments of the present invention.
Figure 9:
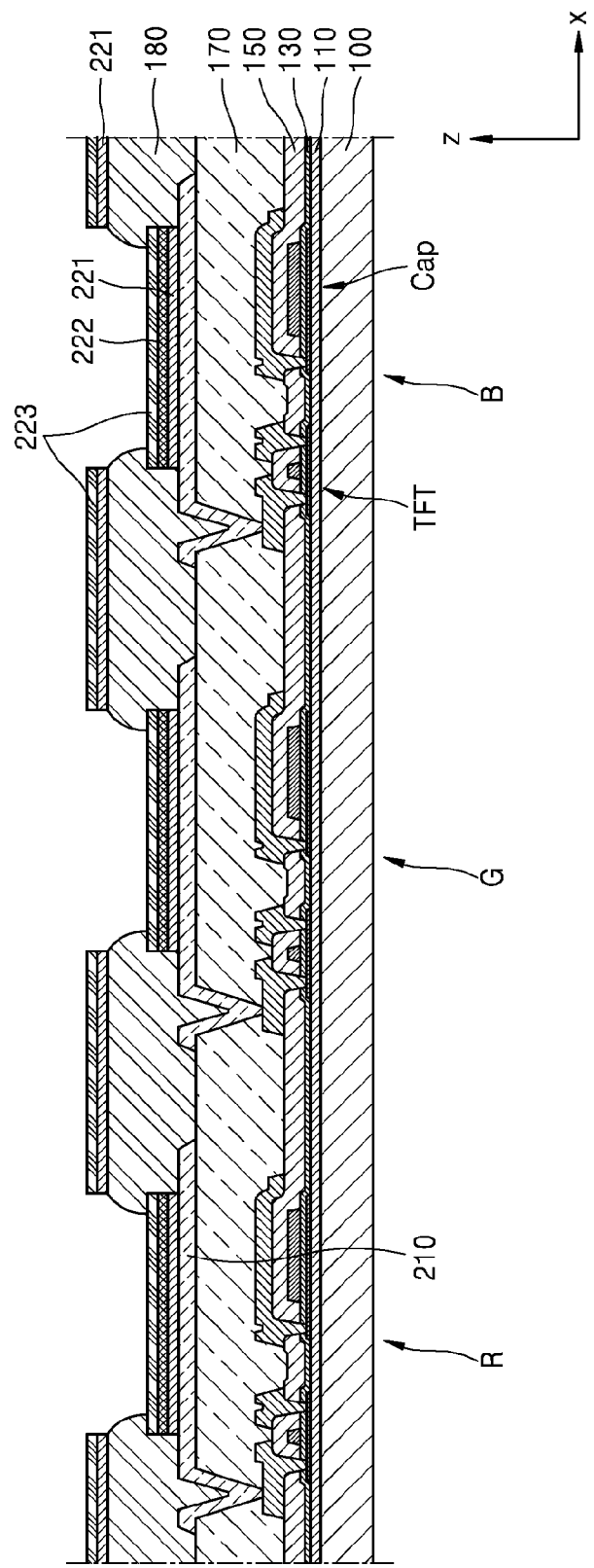
Figure 10:
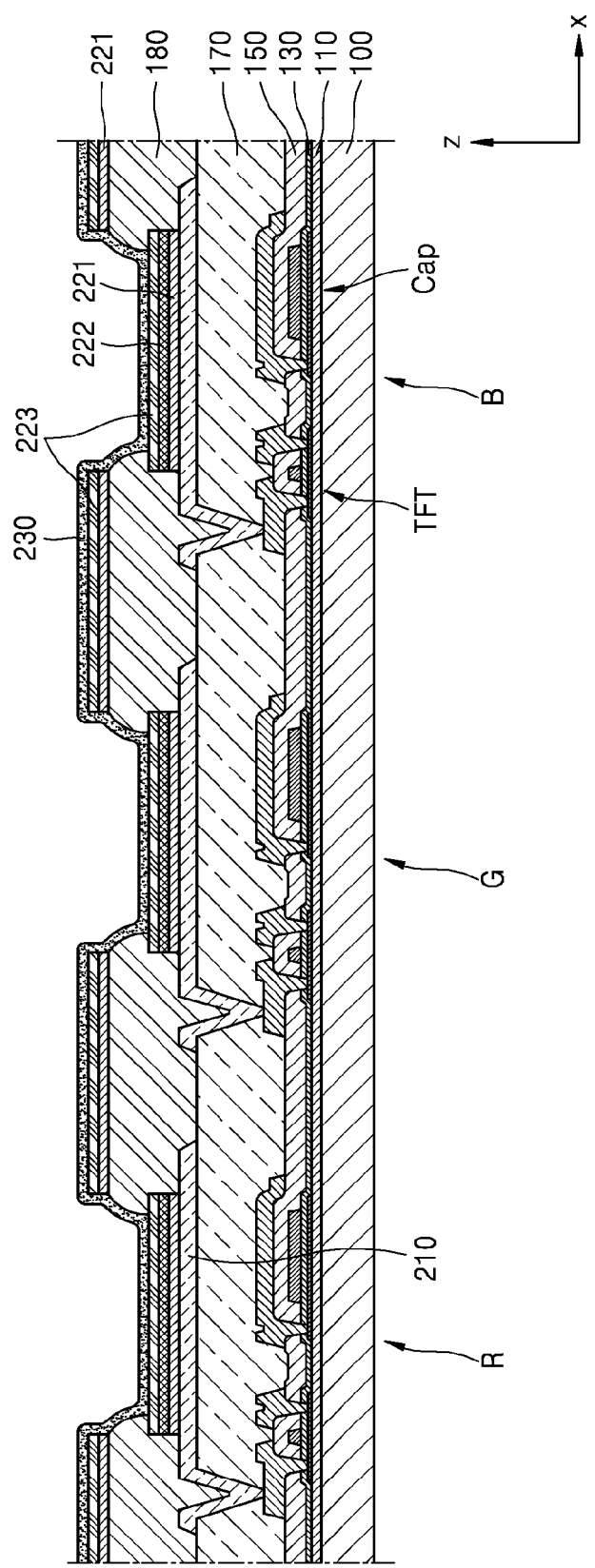

FIGS. 8 through 10 are schematic cross-sectional views illustrating methods of manufacturing an organic light-emitting display apparatus according to exemplary embodiments of the present invention.

According to exemplary embodiments, the emission layer 222 is formed in each of the red subpixel R, the green subpixel G, and the blue subpixel B by using a LITI method, and then, as illustrated in FIG. 8, the second intermediate layer 223, including at least one selected from an electron injection layer and an electron transport layer, is formed on the pixel defining layer 180 and the pixel electrode 210 by using a method such as a deposition method. As the pixel defining layer 180 has a reverse-tapered shape, a portion of the second intermediate layer 223 on the pixel defining layer 180 and a portion of the second intermediate layer 223 the pixel electrode 210 may be discontinuous as illustrated in FIG. 8. When the second intermediate layer 223 is formed using a method such as spin coating method, unlike as shown in FIG. 8, a portion of the second intermediate layer 223 on the pixel electrode 210 may extend to the lateral surface of the pixel defining layer 180 to contact the lateral surface. According to circumstances, the second intermediate layer 223 may not be additionally formed but may be formed using a donor film by using a LITI method as described above.

Next, the pixel defining layer 180 is melted so that an area of the upper surface thereof is decreased to be less than an area of the lower surface thereof as illustrated in FIG. 9. Accordingly, the pixel defining layer 180 is melted to change the reverse-tapered shape to a tapered shape in which the width of the base is greater than or equal to a width of the top of the pixel defining layer 180. The melting of the pixel defining layer 180 may be performed by using an annealing method. For example, by annealing at 120° C. for 60 minutes, the pixel defining layer 180 may be melted without damage to the emission layer 222 or the like, which is formed before the melting operation. As a result of the melting operation, the pixel defining layer 180 is melted to cover at least a portion of an edge of the emission layer 222 while a center portion of the second intermediate layer 223 that is formed on the pixel electrode 210 remains exposed.

After melting the pixel defining layer 180 as described above, a plurality of opposite electrodes 230 respectively corresponding to the plurality of pixel electrodes 210 may be formed on the entire surface of the base substrate 100, as illustrated in FIG. 10, to thereby manufacture the organic light-emitting display apparatus. Here, as the pixel defining layer 180 having a tapered shape instead of a reverse-tapered shape is formed by the melting thereof before forming the opposite electrodes 230, the opposite electrodes 230 may be formed as a single unit to respectively and continuously correspond to or be disposed on the plurality of pixel electrodes 210.

While the method of manufacturing an organic light-emitting display apparatus has been described above, exemplary embodiments of the present invention are not limited thereto. For example, the organic light-emitting display apparatus manufactured by using the method is also included in the scope of the present invention.

The organic light-emitting display apparatus according to exemplary embodiments of the present invention may have a structure as illustrated in FIG. 6. That is, the organic light-emitting display apparatus may include the pixel electrode 210, the emission layer 222 disposed on the pixel electrode 210 and capable of emitting light, the pixel defining layer 180 covering at least a portion of the edge of the emission layer 222 such that the center portion of the emission layer 222 is exposed, and the opposite electrodes 230 that are continuously disposed on the pixel defining layer 180 and the emission layer 222.

According to the organic light-emitting display apparatus according to exemplary embodiments, the pixel defining layer 180 has a tapered shape instead of a reverse-tapered shape, and thus, the opposite electrodes 230 may be formed as a continuous single unit. Also, the pixel defining layer 180 covers at least a portion of the edge of the emission layer 222 while the center portion of the emission layer 222 remains exposed. The organic light-emitting display apparatus is formed by forming the emission layer 222 while the pixel defining layer 180 has a reverse-tapered shape and melting the pixel defining layer 180 after the emission layer 222 is formed. Thus, as the emission layer 222 is formed using a LITI method while the pixel defining layer 180 has a reverse-tapered shape, when detaching the donor film 300 during formation of the emission layer 222, the portion of the transfer layer 340 transferred to the backplane (the emission layer 222) may be relatively cleanly separated from the portion of the transfer layer 340 to which no laser beam is irradiated. Accordingly, a manufacturing yield of the organic light-emitting display apparatus may be increased.

As illustrated in FIG. 6, the first intermediate layer 221 includes at least one selected from a hole injection layer and a hole transport layer may be included. In this case, the first intermediate layer 221 is formed while the pixel defining layer 180 has a reverse-tapered shape, and thus, the first intermediate layer 221 is discontinuous between the portion on the pixel defining layer 180 and the portion on the pixel electrode 210.

Meanwhile, as illustrated in FIG. 7, the second intermediate layer 223 includes at least one selected from an electron injection layer and an electron transport layer may be included. When the pixel defining layer 180 having a reverse-tapered shape is melted before forming the second intermediate layer 223, a portion of the second intermediate layer 223 on the pixel defining layer 180 and a portion of the second intermediate layer 223 on the pixel defining layer 180 may be continuous. If the pixel defining layer 180 having a reverse-tapered shape is melted after forming the second intermediate layer 223, a portion between the portion of the second intermediate layer 223 on the pixel defining layer 180 and the portion of the second intermediate layer 223 on the pixel electrode 210 may be discontinuous. After being melted, the pixel defining layer 180 covers at least a portion of the edge of the second intermediate layer 223 on the pixel electrode 210 while a center portion of the second intermediate layer 223 on the pixel electrode 210 remains exposed.

According to exemplary embodiments, the pixel defining layer 180 having a reverse-tapered shape is formed and then the pixel defining layer 180 is melted so that control over the application of the first intermediate layer 221, the emission layer 222, and the second intermediate layer 223 may be increased.

As described above, according to the one or more of the above exemplary embodiments of the present invention, the organic light-emitting display apparatus in which damages or defects are decreased when forming an emission layer and the method of manufacturing the organic light-emitting display apparatus are provided. However, the scope of the present invention is not limited to the disclosed embodiments.

It should be understood that the exemplary embodiments described therein should be considered in a descriptive sense only and not for purposes of limitation. Descriptions of features or aspects within the exemplary embodiments should typically be considered as available for other similar features or aspects in other embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display apparatus comprising:
a pixel electrode;
an emission layer disposed on the pixel electrode and configured to emit light, the emission layer having a bottom surface and a to surface;
a pixel defining layer that directly covers at least a portion of an edge of the to surface of the emission layer and exposes a center portion of the emission layer; and
a continuous opposite electrode covering the pixel defining layer and the emission layer.

2. The organic light-emitting display apparatus of claim 1, further comprising an intermediate layer interposed between the pixel electrode and the emission layer, the intermediate layer comprising at least one selected from a hole injection layer and a hole transport layer.

3. The organic light-emitting display apparatus of claim 2, wherein a first portion of the intermediate layer is disposed on the pixel defining layer and a second portion of the intermediate layer is disposed on the pixel electrode, and the intermediate layer is discontinuous between the first portion and the second portion.

4. The organic light-emitting display apparatus of claim 1, further comprising an intermediate layer that is interposed between the emission layer and the opposite electrode, the intermediate layer comprising at least one selected from an electron injection layer and an electron transport layer.

5. The organic light-emitting display apparatus of claim 4, wherein a first portion of the intermediate layer is disposed on the pixel defining layer and a second portion of the intermediate layer is disposed on the pixel electrode, and the intermediate layer is continuous between the first portion and the second portion.

6. The organic light-emitting display apparatus of claim 4, wherein a first portion of the intermediate layer is disposed on the pixel defining layer and a second portion of the intermediate layer is disposed on the pixel electrode, and the intermediate layer is discontinuous between the first portion and the second portion.

7. The organic light-emitting display apparatus of claim 6, wherein the pixel defining layer covers at least a portion of an edge of the second portion of the intermediate layer and exposes a center portion of the intermediate layer.

8. The organic light-emitting display apparatus of claim 1, wherein the emission layer is configured to emit red light or green light.

9. The organic light-emitting display apparatus of claim 1, wherein the pixel defining layer comprises a negative photoresist material.

10. A method of manufacturing an organic light-emitting display apparatus, the method comprising:
forming a pixel electrode;
forming a pixel defining layer having a reverse-tapered shape wherein a width of an upper surface of the pixel defining layer disposed away from the pixel electrode is greater than a width of a lower surface of the pixel defining layer disposed toward the pixel electrode, the pixel defining layer being formed to cover an edge of the pixel electrode while a center portion of the pixel electrode is not covered;
forming an emission layer on the pixel electrode;
melting the pixel defining layer such that the width of the upper surface becomes equal to or less than the width of the lower surface; and forming an opposite electrode on the pixel defining layer and the pixel electrode, the opposite electrode being continuous on the pixel defining layer and the pixel electrode.

11. The method of claim 10, wherein the forming of an emission layer comprises a laser induced thermal imaging (LITI) method.

12. The method of claim 10, wherein the melting comprises an annealing method.

13. The method of claim 10, wherein the pixel defining layer is melted to cover at least a portion of an edge of the emission layer while a center portion of the emission layer is not covered.

14. The method of claim 10, further comprising forming an intermediate layer on the pixel defining layer and the pixel electrode, the first intermediate layer comprising at least one selected from a hole injection layer and a hole transport layer,
wherein the emission layer is formed on the first intermediate layer on the pixel electrode.

15. A method of manufacturing an organic light-emitting display apparatus, the method comprising:
forming a pixel electrode;
forming a pixel defining layer having a reverse-tapered shape wherein a width of an upper surface of the pixel defining layer disposed away from the pixel electrode is greater than a width of a lower surface of the pixel defining layer disposed toward the pixel electrode;
forming an emission layer on the pixel electrode;
melting the pixel defining layer such that the width of the upper surface becomes equal to or less than the width of the lower surface;
forming an opposite electrode on the pixel defining layer and the pixel electrode, the opposite electrode being continuous on the pixel defining layer and the pixel electrode; and
forming an intermediate layer on the pixel defining layer and the emission layer, the intermediate layer comprising at least one selected from an electron injection layer and an electron transport layer,
wherein the pixel defining layer is melted such that the pixel defining layer covers at least a portion of an edge of the intermediate layer on the emission layer and a center portion of the second intermediate layer on the emission layer is not covered.

16. The method of claim 10, wherein the emission layer is configured to emit red light or green light.

17. The method of claim 10, wherein the pixel defining layer comprises a negative photoresist material.

* * * * *